(12) United States Patent
Tokumiya et al.

(10) Patent No.: US 11,171,018 B2
(45) Date of Patent: Nov. 9, 2021

(54) METHOD OF FABRICATING SEMICONDUCTOR DEVICE AND ENCAPSULANT

(71) Applicant: SAMSUNG ELECTRONICS CO., LTD., Suwon-si (KR)

(72) Inventors: Takahiro Tokumiya, Suwon-si (KR); Tatsuya Ishimoto, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/001,150

(22) Filed: Aug. 24, 2020

(65) Prior Publication Data
US 2021/0111040 A1    Apr. 15, 2021

(30) Foreign Application Priority Data
Oct. 11, 2019  (JP) ............................. JP2019-187469

(51) Int. Cl.
*H01L 21/56* (2006.01)
*H01L 23/00* (2006.01)
(Continued)

(52) U.S. Cl.
CPC .......... *H01L 21/563* (2013.01); *H01L 21/561* (2013.01); *H01L 21/78* (2013.01);
(Continued)

(58) Field of Classification Search
CPC ..... H01L 21/563; H01L 21/561; H01L 24/81; H01L 25/50; H01L 21/78;
(Continued)

(56) References Cited

U.S. PATENT DOCUMENTS 10,157,892 B1 * 12/2018 Chen ................... H01L 25/0657
2004/0106233 A1 * 6/2004 Lin ......................... H01L 24/29
438/108
(Continued)

FOREIGN PATENT DOCUMENTS

EP          1818351 A1    8/2007
JP       2007051184 A    3/2007
(Continued)

OTHER PUBLICATIONS

Xie, L., et al., "High-throughput Thermal Compression Bonding of 20 um Pitch Cu Pillar with Gas Pressure Bonder for 3D IC Stacking", 2016 IEEE 66th Electronic Components and Technology Conference, May 31, 2016, pp. 108-114.

*Primary Examiner* — Thanh T Nguyen
(74) *Attorney, Agent, or Firm* — Sughrue Mion, PLLC (57) ABSTRACT

A method of fabricating a semiconductor device with improved quality and an encapsulant are provided. The method may include coating a chip wafer including a plurality of semiconductor chips with an encapsulant, performing a pre-curing process to bring the encapsulant into a B-stage, dicing the chip wafer to divide the chip wafer into a plurality of semiconductor chips, forming a chip stack by stacking the semiconductor chip on the base wafer in such a way that a coupling electrode on the base wafer and a bump electrode of each of the semiconductor chips face each other with a conductive adhesive element interposed therebetween, performing a reflow process on the chip stack under pressurized gas to bond the coupling electrode and the bump electrode to each other with the conductive adhesive element interposed therebetween, and performing a post-curing process on the chip stack under pressurized gas to bring the encapsulant into a C-stage.

13 Claims, 7 Drawing Sheets

(51) Int. Cl.
*H01L 21/78* (2006.01)
*H01L 25/00* (2006.01)

(52) U.S. Cl.
CPC .............. *H01L 24/81* (2013.01); *H01L 25/50* (2013.01); *H01L 2224/81143* (2013.01)

(58) Field of Classification Search
CPC ....... H01L 2224/81143; H01L 25/0652; H01L 2225/06565; H01L 2225/06517; H01L 23/562; H01L 2225/06541; H01L 2225/0652; H01L 2225/06513
See application file for complete search history.

(56) References Cited

U.S. PATENT DOCUMENTS

| | | |
|---|---|---|
| 2006/0194064 A1 | 8/2006 | Xiao et al. |
| 2012/0193817 A1 | 8/2012 | Kanamaru et al. |
| 2012/0329249 A1* | 12/2012 | Ahn ................. H01L 24/94 |
| | | 438/464 |
| 2013/0026660 A1 | 1/2013 | Czubarow et al. |
| 2019/0148254 A1* | 5/2019 | Na ................. H01L 23/5226 |
| | | 257/774 |
| 2020/0411393 A1* | 12/2020 | Kim ................. H01L 23/3128 |

FOREIGN PATENT DOCUMENTS

| | | |
|---|---|---|
| JP | 2007211244 A | 8/2007 |
| JP | 2012119358 A | 6/2012 |
| JP | 5278457 B2 | 9/2013 |
| JP | 2014521754 A | 8/2014 |
| JP | 2018123340 A | 8/2018 |
| WO | 2013018847 A1 | 2/2013 |
| WO | 2016148121 A1 | 9/2016 |

\* cited by examiner

METHOD OF FABRICATING SEMICONDUCTOR DEVICE AND ENCAPSULANT

CROSS-REFERENCE TO RELATED APPLICATION(S)

This application claims priority under 35 U.S.C. § 119 to Japanese Patent Application No. 2019-187469, filed on Oct. 11, 2019, in the Japanese Patent Office, the entire contents of which are hereby incorporated by reference.

BACKGROUND

The present disclosure relates to a method of fabricating a semiconductor device and an encapsulant, and in particular, to a method of bonding a semiconductor chip on a base wafer during the fabrication of a semiconductor device and an encapsulant.

In a semiconductor packaging process, an under fill method is used to bond a semiconductor chip to a base wafer. To this end, the semiconductor chip is first placed on the base wafer, and then, a reflow process is performed to bond the semiconductor chip to the base wafer. After the bonding process, a gap between the semiconductor chip and the base wafer is filled with an encapsulant by the under fill method. However, it is difficult to apply the under fill method to a three-dimensional stacking process using a through-silicon via (hereinafter, TSV) technology. This is because, due to fine bumps, the gap is too small. Thus, proposed is a method of attaching a film, such as a non-conductive film (NCF), which is used as the encapsulant, on the base wafer, before the placing of the semiconductor chip.

In the case where the NCF is used, an amount of the encapsulant can be controlled to about a film thickness. Accordingly, in the case where a change in film thickness is required owing to a change in packing design or process, the film fabrication process should be changed. In addition, there are other problems; for example, a void may be formed in the film attaching process and the thicker the film, the more of the encapsulant is required.

Furthermore, since the NCF-using method is not a bulk bonding process using the reflow process, a thermal compression bonding (TCB) process is required. Accordingly, it takes a long time to compress each semiconductor chip, and thus, the throughput may be lowered.

Thus, a method of forming a liquid encapsulant, instead of the NCF, in a spin coating manner and heating to remove bubbles and solvent and to bring it into a B-stage (half-cured) state has been suggested.

SUMMARY

Example embodiments provide a method of fabricating a high quality semiconductor device and an encapsulant therefor.

In accordance with an aspect of an example embodiment, there is provided a method of fabricating a semiconductor device, the method including: forming an encapsulant on a chip wafer; performing a pre-curing process on the encapsulant, which is formed on the chip wafer, to form a B-staged encapsulant; dicing the chip wafer, along with the B-staged encapsulant, to divide the wafer into a plurality of semiconductor chips that are separate from each other; stacking the plurality of semiconductor chips on a base wafer, such that a coupling electrode provided on the base wafer faces a respective bump electrode of each semiconductor chip from among the plurality of semiconductor chips with a conductive adhesive element interposed between the coupling electrode and each bump electrode, thereby forming a chip stack including the base wafer and the plurality semiconductor chips on the base wafer; performing a reflow process on the chip stack under a first pressurized gas to bond the coupling electrode and each bump electrode, between which the conductive adhesive element is interposed, to each other; and performing a post-curing process on the chip stack, in which the coupling electrode and each bump electrode are bonded to each other with the conductive adhesive element interposed between, under a second pressurized gas to form a C-staged encapsulant.

In accordance with an aspect of an example embodiment, there is provided an encapsulant configured to cover a chip wafer, the encapsulant including: a resin; and a flux ingredient, wherein the encapsulant is configured to be in a B-stage state by a pre-curing process, wherein the encapsulant is provided to allow the chip wafer to be divided into a plurality of semiconductor chips, when the encapsulant, along with the chip wafer, is diced after being in the B-stage state, wherein the encapsulant is provided to be stacked on a base wafer, along with at least one semiconductor chip from among the plurality of semiconductor chips, to form a chip stack such that the at least one semiconductor chip is stacked on the base wafer and such that a coupling electrode on the base wafer and a respective bump electrode of each semiconductor chip from among the at least one semiconductor chip face each other with a conductive adhesive element interposed between the coupling electrode and each bump electrode, wherein a reflow process is performed on the chip stack under a first pressurized gas to bond the coupling electrode and each bump electrode to each other with the conductive adhesive element interposed therebetween, the chip stack including the base wafer and the at least one semiconductor chip on the base wafer, and wherein the encapsulant is configured to be in a C-stage state by a post-curing process, the post-curing process performed on the chip stack under a second pressurized gas after the reflow process.

In accordance with an aspect of an example embodiment, there is provided a method of forming a semiconductor device, the method including: covering a chip wafer with an encapsulant; partially curing the encapsulant by applying heat; dicing the chip wafer and partially cured encapsulant to divide the chip wafer a plurality of semiconductor chips that are separate from each other, each semiconductor chip from among the plurality of semiconductor chips comprising a respective portion of the chip wafer and a respective portion of the partially cured encapsulant; stacking at least one semiconductor chip from among the plurality of semiconductor chips onto a base wafer; applying a first pressurized gas to the partially cured encapsulant; and fully curing the partially cured encapsulant by applying a second pressurized gas.

BRIEF DESCRIPTION OF THE DRAWINGS

The above and other aspects, features, and advantages of certain example embodiments will be more apparent from the following description taken in conjunction with the drawings, in which.

DETAILED DESCRIPTION

Example embodiments will now be described more fully with reference to the accompanying drawings. It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

Figure 1:
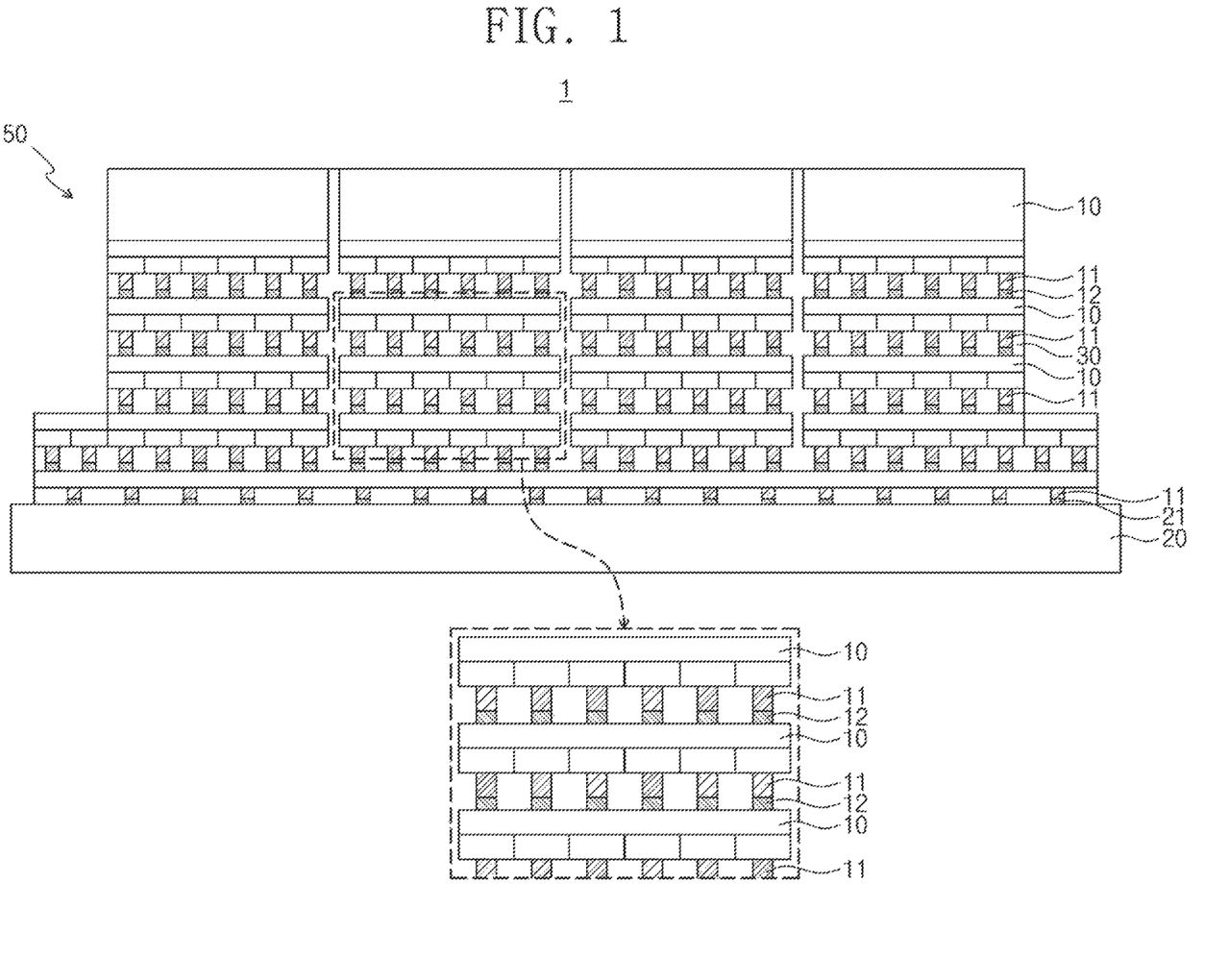
FIG. 1 is a side view illustrating a semiconductor device according to an example embodiment.

Hereinafter, a semiconductor device and a fabrication method thereof according to example embodiments will be described. FIG. 1 is a side view illustrating a semiconductor device according to an example embodiment. Referring to FIG. 1, a semiconductor device 1 may include a plurality of semiconductor chips 10, a base wafer 20, and an encapsulant 30.

In an example embodiment, semiconductor chips 10 may be formed together on a chip wafer and then separated from each other by, for example, dicing the chip wafer. The semiconductor chips 10 may then be stacked on the base wafer 20 to form a multi-layered stack. For example, the semiconductor chips 10 may be stacked on the base wafer 20 in a Chip-on-Wafer (CoW) method. A bump electrode 11 may be formed in the semiconductor chip 10. In an example embodiment, by using a through-silicon via (TSV) technology, the semiconductor chips 10 may be provided in the form of a three-dimensional stack. A through electrode of TSV may be electrically connected to the bump electrode 11. A coupling electrode 12, to which the through electrode is electrically connected, may be formed on a surface, which is opposite to a surface provided with the bump electrode 11 of the semiconductor chip 10. In other words, each semiconductor chip 10 may include a bump electrode 11 on one surface and a corresponding coupling electrode 12 on the opposite surface.

The base wafer 20 may include a plurality of fine interconnection lines, which are formed on its surface, and a coupling electrode 21, which is coupled to the interconnection lines. The coupling electrode 21 of the base wafer 20 may be electrically connected to the bump electrode 11 of the corresponding semiconductor chip 10 with a conductive adhesive element interposed therebetween. The conductive adhesive element may be, for example, a solder. The coupling electrode 12 of the semiconductor chip 10 may be electrically connected to the bump electrode 11 of another semiconductor chip 10 with a conductive adhesive element interposed therebetween. Hereinafter, the base wafer 20 and the semiconductor chips 10 stacked on the base wafer 20 will be referred to as a chip stack 50. The chip stack 50 may be encapsulated by the encapsulant 30.

In an example embodiment, the encapsulant 30 may be in a liquid state, when it is formed on the chip wafer before the chip wafer is separated into semiconductor chips 10. In this case, the encapsulant 30 may cover the chip wafer to a uniform thickness, without any void therein. In an example embodiment, the encapsulant 30 may be coated on the chip wafer, and then a pre-curing process may be performed to bring the encapsulant 30 into a B-stage state. The encapsulant 30 in the B-stage state, along with the chip wafer, may be diced, and in this case, the chip wafer may be divided into the semiconductor chips 10. The semiconductor chips 10 may be separated apart from each other. In addition, the encapsulant 30 (e.g. B-staged encapsulant 30) may have an adhesion strength that is high enough to provisionally fix each of the diced semiconductor chips 10 to the base wafer 20 or to another of the diced semiconductor chips 10, when one semiconductor chip 10 of the diced semiconductor chips 10 is stacked on the base wafer 20 and another semiconductor chip 10 of the diced semiconductor chips 10.

The encapsulant 30, along with the semiconductor chip 10, may be stacked on the base wafer 20, such that the coupling electrode 21 on the base wafer 20 and the bump electrode 11 of the semiconductor chip 10 face each other with a conductive adhesive element interposed therebetween. In addition, the encapsulant 30, along with the semiconductor chip 10, may be stacked on another semiconductor chip 10, such that the coupling electrode 12 on the another semiconductor chip 10 and the bump electrode 11 of the one semiconductor chip 10 face each other with a conductive adhesive element interposed therebetween. A chip stack 50 may be formed to include the base wafer 20 and one or more of the semiconductor chips 10 stacked on top of each other.

Next, a reflow process may be performed on the chip stack 50 under a pressurized gas (i.e., a first pressurized gas) to bond the bump electrode 11 to a corresponding one of the coupling electrodes 21 and 12 with the conductive adhesive element interposed therebetween, and then, the post-curing process may be performed on the chip stack 50 under a pressurized gas (i.e., a second pressurized gas) to bring the encapsulant 30 into a C-stage state. The reflow process and the post-curing process may be performed under the pressurized gas of, for example, 1.0 MPa or higher. In an example embodiment, the gas may be inert gas or nitrogen gas. The gas used in the reflow process may be the same as or different from the gas used in the post-curing process. Owing to the reflow process and the post-curing process performed under the pressurized gas, it may be possible to suppress the formation of voids and the warpage and misalignment of the semiconductor chip 10.

In an example embodiment, the encapsulant 30 may include c (10-40%), epoxy resin (5-50%), phenolic resin having phenolic hydroxyl group (10-30%), propylene glycol methyl ether acetate (PEGMIA) solvent (5-50%), and flux (1-5%). Regarding to composition of the encapsulant 30, a percent (%) of an element given above may refer to a weight percent (wt %).

The encapsulant 30 may include epoxy resin and phenolic resin. The encapsulant 30 may form a cross-linking structure by, for example, a post-curing process. In an example embodiment, the encapsulant 30 may include a flux ingredient that is not volatilized by the reflow process. The reflow process may be performed at a temperature higher than a melting temperature of a solder, which is the conductive adhesive element. For example, the melting temperature of the solder depends on the kind of the solder but may range from 225° C. to 250° C. in general. For example, the encapsulant 30 may include flux that is not volatilized at 240° C. Owing to this, when the conductive adhesive element, such as the solder, is melted during the reflow process at a temperature lower than 240° C., the coupling electrode 21 of the base wafer 20, the solder, and the bump electrode 11 may be coated, without the volatilization of the flux. Thus, an oxide removal process may not be necessary.

The encapsulant 30 may be softened by the reflow process. Thus, in the case where the reflow process is performed under the pressurized gas, the coupling electrode 21 and the bump electrode 11 may be self-aligned to each other, and the bump electrode 11 and the coupling electrode 21 may be bonded to each other in bulk.

For the encapsulant 30, it may be desirable to increase a curing delay between the B-stage (i.e., half-cured or partially cured) state and the C-stage (full-cured) state. In other words, the encapsulant 30 may not be cured yet, when the semiconductor chip 10 is placed on the base wafer 20 and when the reflow process is performed, and may be cured by a post-curing process after the reflow process. Thus, during the reflow process, the coupling electrode 21 and the bump electrode 11 may be self-aligned to each other, and the bump electrode 11 and the coupling electrode 21 may be bonded to each other in bulk.

The encapsulant 30 may have a low weight reduction ratio in the reflow process. The flux and the solvent may remain after the reflow process. Thus, the epoxy resin and the phenolic resin may also remain. When measured by, for example, a thermogravimetric-differential thermal analysis (TG-DTA), the weight reduction ratio of the encapsulant 30 may be less than 0.2% at a temperature of 255° C. during the reflow process. Owing to this, it may be possible to suppress the warpage or misalignment of the semiconductor chip 10 in the reflow process.

A thixotropic index of the encapsulant 30 may have a predetermined value. The thixotropic index of the encapsulant 30 before the coating of the chip wafer may range from 1.1 to 3.5. When the thixotropic index is smaller than 1.1, the viscosity is not low enough, and thus, the encapsulant 30 may be trapped in a spray apparatus used to apply the encapsulant 30, thereby causing deterioration in a leveling property. By contrast, when the thixotropic index is greater than 3.5, the viscosity is too low, and thus, it is hard to form a thick layer, although the coating property of the spray apparatus can be improved.

The encapsulant 30 may include a filler. The filler may adjust material properties (e.g., viscosity) of the encapsulant 30. The encapsulant 30 may include, for example, a filler whose particle diameter is 15 μm or less. If the particle diameter of the filler is greater than 15 μm, there may be a difficulty in providing it through a spray device.

Figure 2:
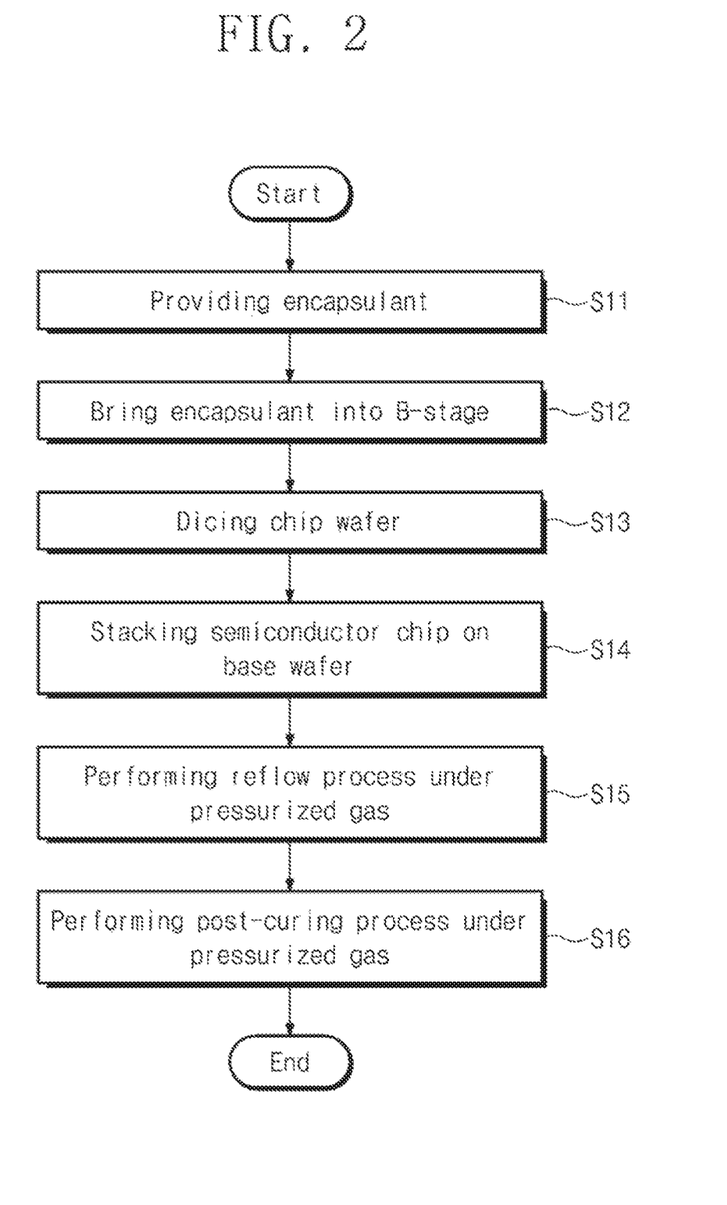
FIG. 2 is a flow chart illustrating a method of fabricating a semiconductor device according to an example embodiment.

A method of fabricating the semiconductor device 1 will be described below. FIG. 2 is a flow chart illustrating a method of fabricating a semiconductor device according to an example embodiment. FIGS. 3 to 8 are process diagrams illustrating a method of fabricating a semiconductor device according to an example embodiment.

Figure 3:
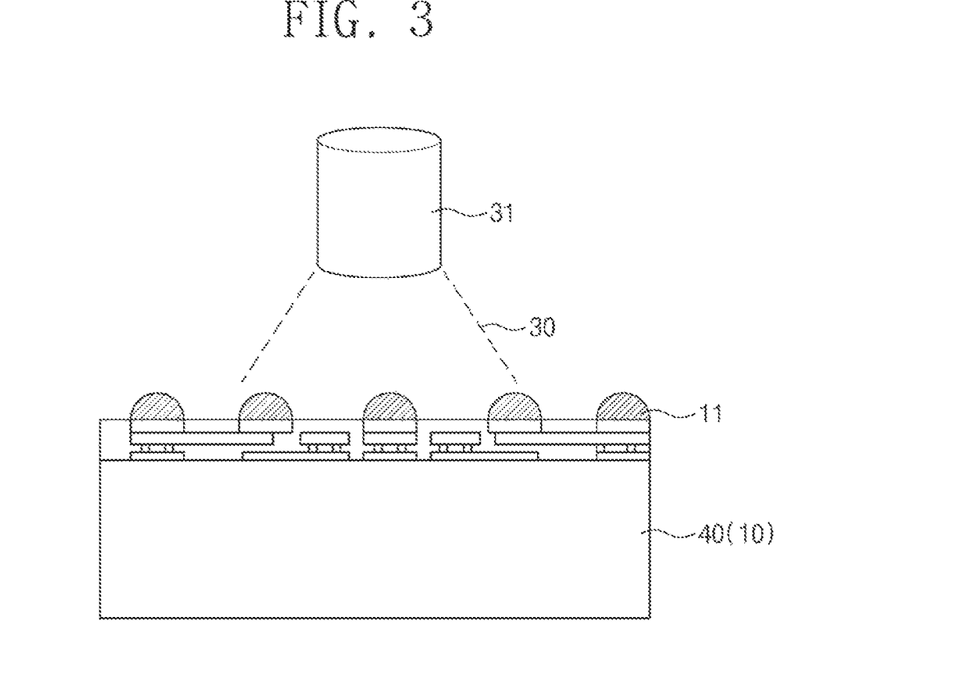
FIG. 3 is a process diagram illustrating a method of fabricating a semiconductor device according to an example embodiment.

Referring to Step S11 of FIG. 2 and FIG. 3, the encapsulant 30 may be provided. In detail, for example, the encapsulant 30 may be provided to cover a chip wafer 40 using a spray apparatus 31. The chip wafer 40 may include a plurality of the semiconductor chips 10, before a dicing step. The bump electrode 11 may be formed on the semiconductor chip 10. The encapsulant 30 may be coated to a uniform thickness to prevent the formation of a void.

Figure 4:
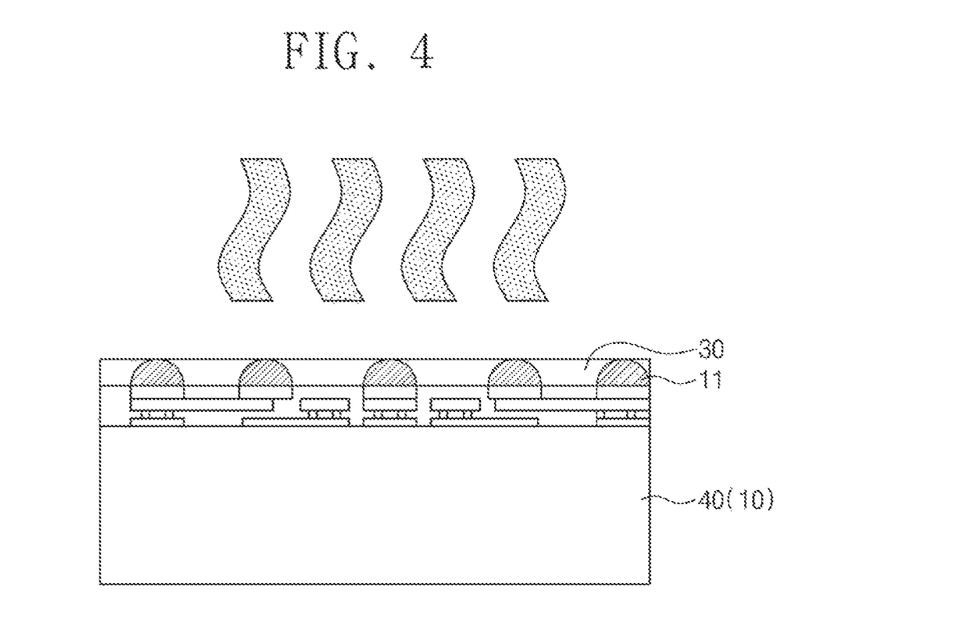
FIG. 4 is a process diagram illustrating a method of fabricating a semiconductor device according to an example embodiment.

Next, referring to Step S12 of FIG. 2 and FIG. 4, a process of bringing the encapsulant 30 into a B-stage may be performed. In detail, the encapsulant 30 coated on the chip wafer 40 may be brought into the B-stage by a pre-curing process. For example, the encapsulant 30 is coated on the chip wafer 40, and then the solvent may be evaporated by heating the chip wafer 40 at 70° C. for 1 hour using an oven. Owing to this, the encapsulant 30 may be in the B-stage state. Since the encapsulant 30 is in the B-stage state, the encapsulant 30 may be diced along with the semiconductor chip 10. Furthermore, the encapsulant 30 (e.g. B-staged encapsulant 30) may have an adhesion strength that is high enough to provisionally fix the diced semiconductor chip 10, when the diced semiconductor chip 10 is mounted on the base wafer 20.

Figure 5:
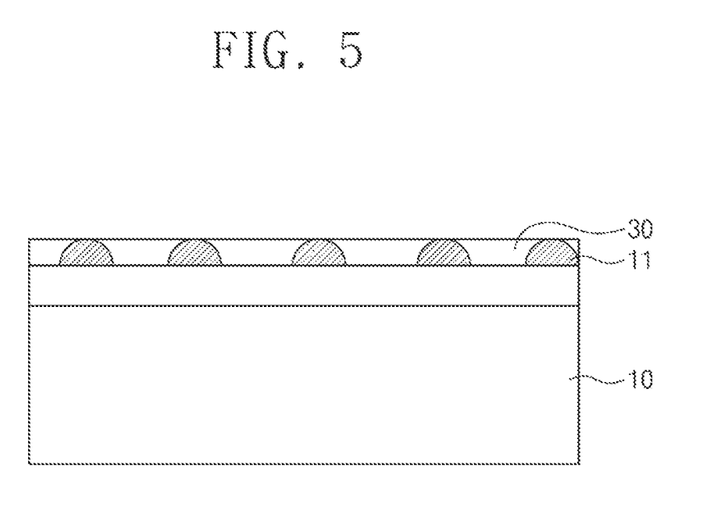
FIG. 5 is a process diagram illustrating a method of fabricating a semiconductor device according to an example embodiment.

Next, referring to Step S13 of FIG. 2 and FIG. 5, the chip wafer 40 may be diced. For example, a back-side grinding process may be performed on a back surface of the chip wafer 40. The back surface of the chip wafer 40 may be opposite to a pattern surface. The pattern surface of the chip wafer 40 may be a surface, on which the encapsulant 30 is coated and the bump electrode 11 of the semiconductor chip 10 or the like is formed. For example, the back-side grinding process on the back surface of the chip wafer 40 may be performed to a depth of 100 μm (e.g., a layer having a thickness of 100 μm may be removed from the back surface of the chip wafer 40), and then, the semiconductor chip 10 may be sliced by using a blade dicing apparatus. For example, a thickness of the chip wafer 40 may be reduced by about 100 μm during the back-side grinding process.

By dicing the chip wafer 40 along with the B-staged encapsulant 30, the chip wafer 40 may be divided into the semiconductor chips 10. In addition, through electrodes of TSV and the coupling electrode 12 may be formed.

Figure 6:
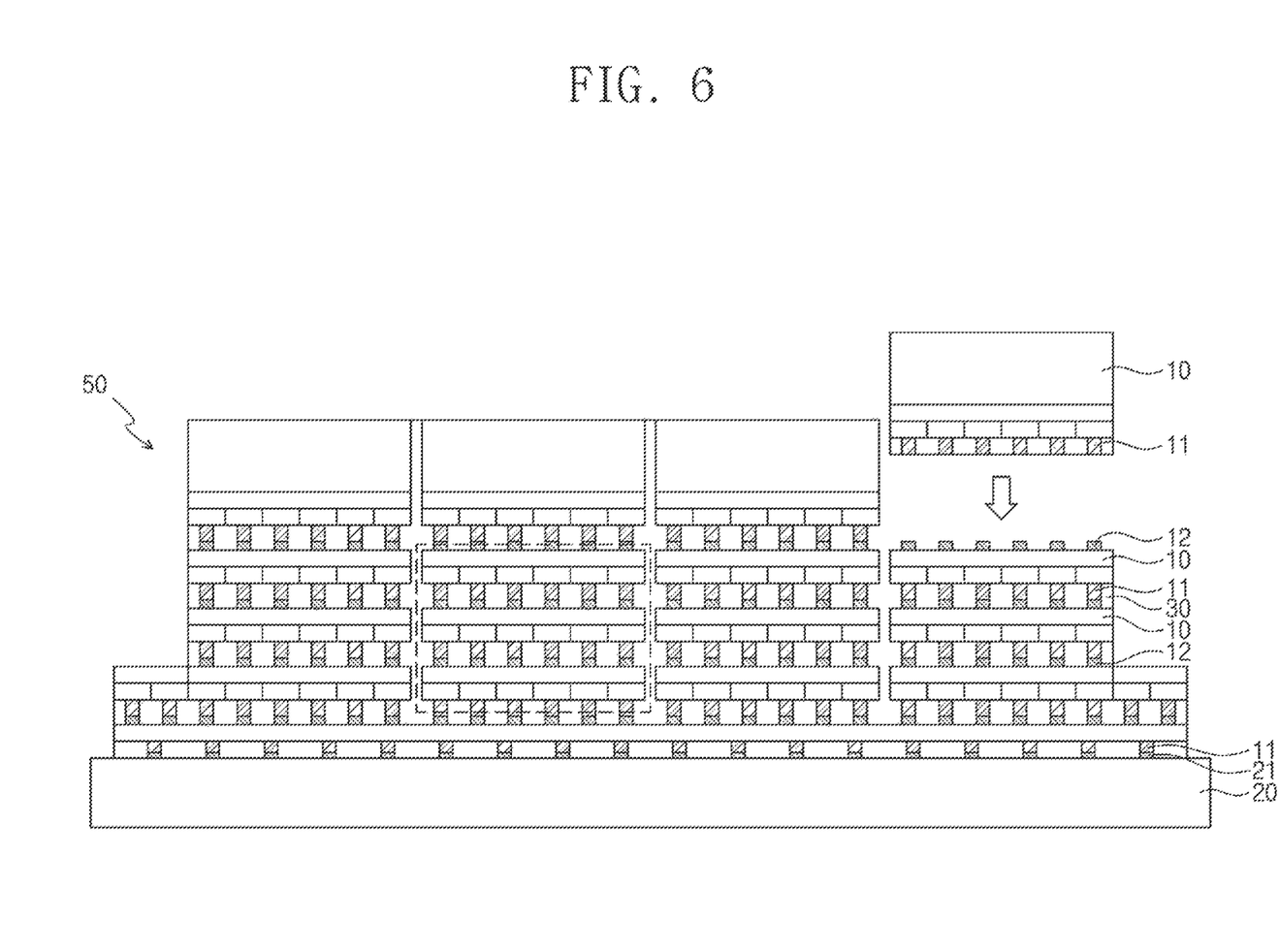
FIG. 6 is a process diagram illustrating a method of fabricating a semiconductor device according to an example embodiment.

Next, referring to Step S14 of FIG. 2 and FIG. 6, the semiconductor chip 10 may be stacked on the base wafer 20. In detail, the semiconductor chip 10 may be stacked on the base wafer 20, such that the coupling electrode 21, which is formed on the base wafer 20, and the bump electrode 11 of the semiconductor chip 10 face each other with a conductive adhesive element interposed therebetween. In addition, the semiconductor chip 10 may be stacked on another semiconductor chip 10, such that the coupling electrode 12 on the another semiconductor chip 10 and the bump electrode 11 of the semiconductor chip 10 face each other with a conductive adhesive element interposed therebetween.

For example, the sliced semiconductor chip 10 may be stacked on the base wafer 20 using a flip-chip bonder. When the semiconductor chip 10 is stacked on the base wafer 20, it may be heated to 100° C. and may be pressured for 2 seconds with a weight of 80N. Owing to this, the semiconductor chip 10 stacked on the base wafer 20 may be temporarily fixed at a softening temperature of the encapsulant 30. Hereinafter, a structure including the base wafer 20 and the semiconductor chips 10 will be referred to as the chip stack 50. That is, the chip stack 50 may be formed at this step.

Figure 7:
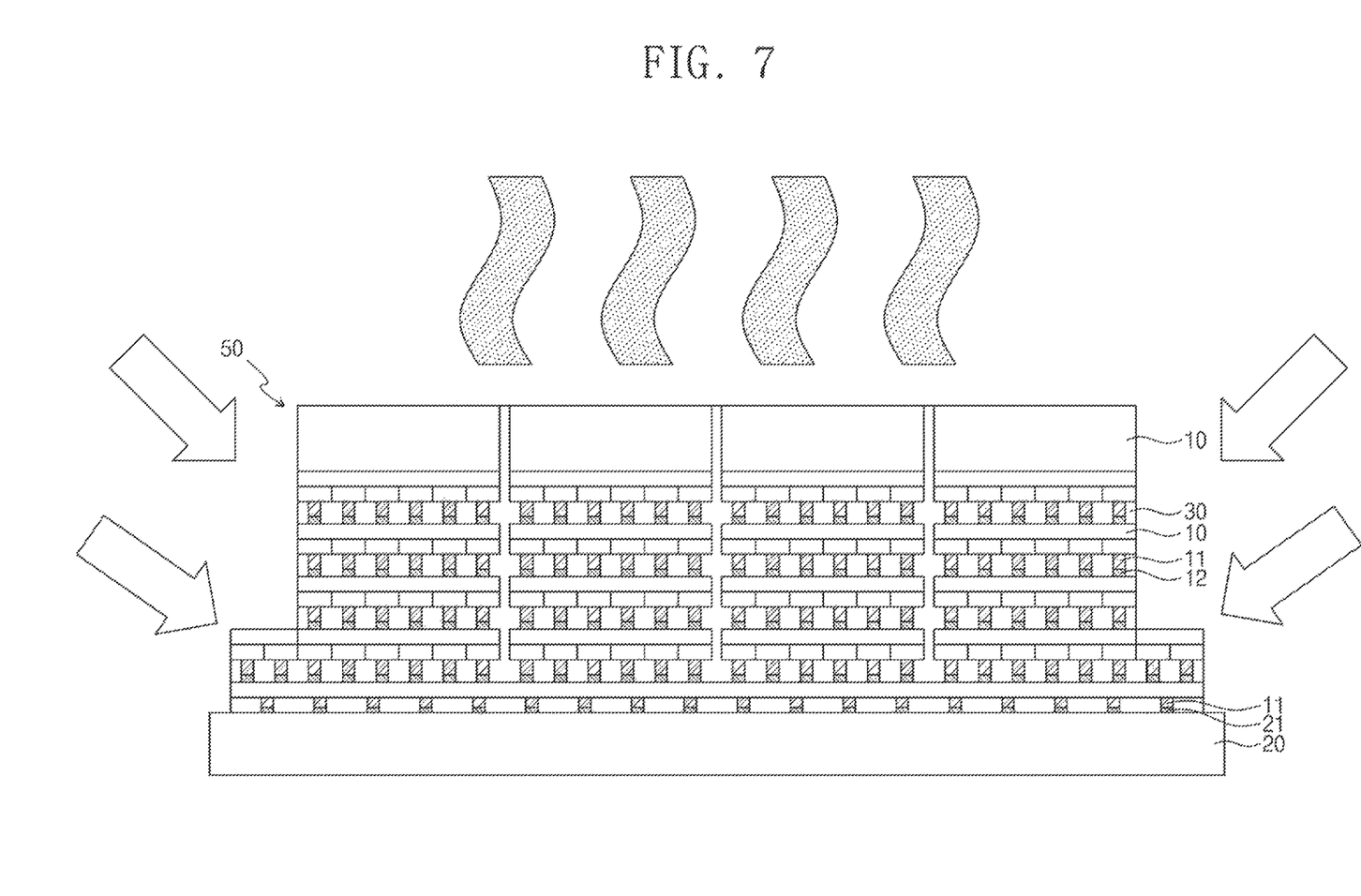
FIG. 7 is a process diagram illustrating a method of fabricating a semiconductor device according to an example embodiment.

Next, referring to Step S15 of FIG. 2 and FIG. 7, a reflow process may be performed on the chip stack 50 under pressurized gas. In detail, as a result of the reflow process performed on the chip stack 50 under the pressurized gas, the bump electrode 11 and a corresponding one of the coupling electrodes 21 and 12 may be bonded to each other with conductive adhesive elements interposed therebetween.

A pressurized oven may be used for the reflow process. In an example embodiment, the chip stack 50 may be heated in the pressurized oven that is filled with, for example, nitrogen. The gas pressure may be higher than or equal to, for example, 1.0 MPa. By heating the chip stack 50 to a melting point of a solder, which is used as the conductive adhesive element, the bump electrode 11 may be bonded to a corresponding one of the coupling electrodes 21 and 12. As a result of the reflow process under the pressurized gas, the formation of a void may be suppressed.

As a result of the reflow process under the pressurized gas, the bump electrode 11 and a corresponding one of the coupling electrodes 21 and 12 may be aligned to each other in a self-aligned manner. Even if the bump electrode 11 and corresponding one of the coupling electrodes 21 and 12 are placed at misaligned positions before the reflow process, the reflow process under the pressurized gas may result in melting of the conductive adhesive element and softening of the encapsulant 30. Accordingly, the bump electrode 11 and corresponding one of the coupling electrodes 21 and 12 may be re-arranged to stable positions.

Owing to this, the bump electrode 11 and corresponding one of the coupling electrodes 21 and 12 may be aligned to each other in a self-aligned manner. In addition, it may be possible to form bump bonding, while suppressing the warpage or misalignment of the semiconductor chip 10. Furthermore, the bump electrodes 11 of the semiconductor chips 10 and corresponding ones of the coupling electrodes 21 and 12 may be bonded to each other in bulk.

Figure 8:
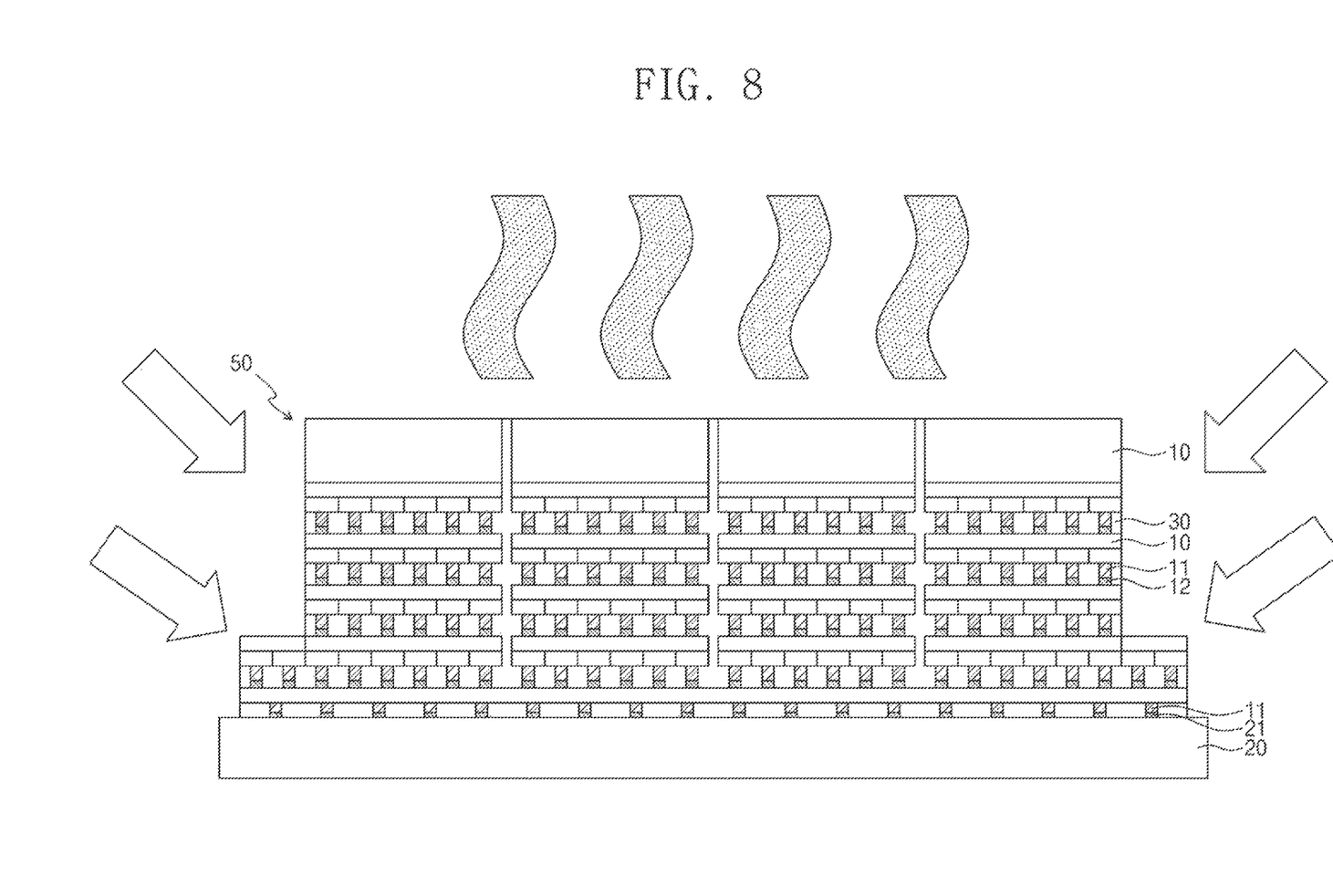
FIG. 8 is a process diagram illustrating a method of fabricating a semiconductor device according to an example embodiment.

Next, referring to Step S16 of FIG. 2 and FIG. 8, a post-curing process may be performed on the chip stack 50 under pressurized gas. In detail, by performing the post-curing process on the chip stack 50 under the pressurized gas, the encapsulant 30 may be placed in a C-stage state. For example, the chip stack 50 may be heated in a pressurized oven filled with nitrogen. The gas pressure may be higher than or equal to, for example, 1.0 MPa. The pressure of 1.0 MPa or higher may be maintained at 160° C. for 2 hours. As a result of the post-curing process, the encapsulant 30 may be thermally cured.

In the method of fabricating the semiconductor device 1 according to the present example embodiment, the reflow process and the post-curing process may be performed under gas pressurized to 1.0 MPa or higher. In an example embodiment, the reflow process and the post-curing process may be performed under gas pressurized to the same pressure. For example, the post-curing process may be performed under the same pressure condition at which the reflow process is performed, and in this case, it may be possible to simplify a setting step of the gas pressure.

In certain embodiments, the reflow process may be performed under a pressure condition higher than that for the post-curing process. In this case, it may be possible to inject the encapsulant 30 into a gap between the semiconductor chips 10 during the reflow process, to suppress the formation of a void before the curing of the encapsulant 30, and to realize the self-alignment of the bump electrodes 11 and corresponding ones of the coupling electrodes 21 and 12. Furthermore, this may make it possible to facilitate the evaporation of the flux and solvent at the post-curing process.

In certain embodiments, the pressure at the reflow process may be lower than that at the post-curing process, depending on properties of the encapsulant 30.

Measurement results, such as thickness of the encapsulant 30 after the coating process, the presence of a void in the encapsulant 30 after the coating, bonding characteristics of the semiconductor chip 10, warpage characteristics of the semiconductor chip 10, misalignment of the semiconductor chip 10, and the presence of a void in the encapsulant 30 after the post-curing process, measured from a semiconductor device fabricated by the method according to an example embodiment, are provided below.

[Thickness of the Encapsulant 30 Measured after the Coating Process]

The chip wafer 40 was coated with the encapsulant 30, the solvent in the encapsulant 30 was dried, the chip wafer 40 was cut using a blade dicing apparatus, and then, the thickness of the encapsulant 30 was measured. At both of central and edge portions of the chip wafer 40, the encapsulant 30 had a uniform thickness of 20 μm±1 μm and there was no edge bead.

[Void in the Encapsulant 30 after the Coating Process]

The chip wafer 40 was coated with the encapsulant 30, the solvent in the encapsulant 30 was dried, and then, the chip wafer 40 was inspected using an ultrasonic imaging device. The maximum size of a void was about 20 μm, which was smaller than 1% of the chip area of the semiconductor chip 10.

[Bonding Characteristics of the Semiconductor Chip 10]

The post-curing process was performed on the chip stack 50 including a plurality of the semiconductor chips 10 stacked on the base wafer 20, the chip stack 50 was cut in a stacking direction, and then, the cross-section of the chip stack 50 was inspected using a scanning electron microscope (SEM) apparatus to examine bonding characteristics of the bump. There was no un-bonded bump electrode.

[Warpage Characteristics of the Semiconductor Chip 10]

The post-curing process was performed on the chip stack 50 including a plurality of the semiconductor chips 10 stacked on the base wafer 20, the chip stack 50 was cut in a stacking direction, and then, a height of a gap between the stacked semiconductor chips 10 was measured from the cross-section of the chip stack 50. At both of central and edge portions of the chip stack 50, the gap had a uniform height of 18 μm±1 μm, and there was no warpage of the chip stack 50 and the semiconductor chips 10.

[Misalignment of the Semiconductor Chip 10]

The post-curing process was performed on the chip stack 50 including a plurality of the semiconductor chips 10 stacked on the base wafer 20, the chip stack 50 was cut in a stacking direction, and then, the cross-section of the chip stack 50 was inspected using a scanning electron microscope (SEM) apparatus. The positional precision between the bump electrodes 11 of the chip stack 50 and the coupling electrodes 21 and 12 was ±1.5 μm.

[Void in the Encapsulant 30 after the Post-Curing Process]

The post-curing process was performed on the chip stack 50 including a plurality of the semiconductor chips 10 stacked on the base wafer 20, and then, the chip stack 50 was inspected using an ultrasonic imaging device. The maximum size of a void was about 300 μm, which was smaller than 1% of an area of each of the semiconductor chip 10.

Technical effects according to an example embodiment will be described.

The method of fabricating the semiconductor device 1 according to an example embodiment may include performing the reflow process and the post-curing process under the pressurized gas. Accordingly, it may be possible to effectively inject the encapsulant 30 into a gap between the semiconductor chips 10 during a three-dimensional packaging process, even when the gap is small, and thus, the quality of the semiconductor device 1 may be improved. In addition, since the encapsulant 30 can be injected into the gap between the semiconductor chips 10 without excess and deficiency, it may be possible to improve efficiency in using a source material of the encapsulant 30.

Furthermore, in the method of fabricating the semiconductor device 1 according to an example embodiment, since the encapsulant 30 in a liquid state is provided by the spray apparatus 31, it may be possible to easily control the thickness of the encapsulant 30, compared with the case of NCF. In an example embodiment, the encapsulant 30 may be provided on the bump electrode 11 of the semiconductor chip 10, but not on the base wafer 20. If the encapsulant 30 is provided on the base wafer 20, there may be a difficulty in injecting the encapsulant 30 into the gap between the semiconductor chips 10, when the pitch of the bump electrodes 11 of the semiconductor chip 10 is small. By contrast, according to an example embodiment, since the encapsulant 30 is provided on the bump electrode 11 of the semiconductor chip 10, the encapsulant 30 can be effectively injected into the gap between the semiconductor chips 10, even when the pitch of the bump electrodes 11 is small. Moreover, since it is pressurized by the gas of 1.0 MPa or higher, the encapsulant 30 may be more effectively injected into the gap between the semiconductor chips 10.

In the method of fabricating of the semiconductor device 1 according to an example embodiment, the semiconductor chip 10 may be provisionally fixed by using the encapsulant 30 in the B-stage state, not by performing a thermo-compression in each step of stacking one semiconductor chip 10 on the base wafer 20 at a time. Thereafter, the chip stack 50 may be formed and then the reflow process may be performed under the pressurized gas. Accordingly, the bump electrodes 11 of the semiconductor chips 10 and corresponding ones of the coupling electrodes 21 and 12 may be bonded to each other in bulk.

In the case of the thermo-compression method, it is necessary to precisely control each pair of the bump electrode 11 and corresponding one of the coupling electrodes 21 and 12, which will be bonded to each other, and thus, it takes a long time to perform this method. Thus, in the thermo-compression method, it may be difficult to improve the throughput of the process. By contrast, according to an example embodiment, since, during the reflow process, the conductive adhesive element is melted and the encapsulant 30 is softened, the bump electrodes 11 of the semiconductor chips 10 and corresponding ones of the coupling electrodes 21 and 12 may be aligned to each other in a self-aligned manner, even when there is an existing misalignment therebetween, and moreover may be bonded to each other in bulk. That is, it may be possible to suppress the problem of misalignment in the bonding process and to improve the throughput in the bonding process.

Since the reflow process and the post-curing process are performed under the pressurized gas, it may be possible to suppress an edge bead issue, which holds that the encapsulant 30 is overflown to the outside of the chip stack.

In certain example embodiments, when multiple semiconductor chips are stacked on the base wafer, there may be a difference in temperature between layers during the reflow process. The encapsulant may be thermally expanded by heat supplied during the reflow process, and in this case, the gap between the semiconductor chips may be expanded. This may make the gaps between the semiconductor chips different from each other and consequently, there may be a layer with un-bonded bumps. This may cause the warpage or deformation issue of the semiconductor chip or the vertical misalignment issue between top and bottom ends of TSV, and thus, the quality of the semiconductor device may deteriorate.

To solve this issue, the reflow process may be performed under the condition of pressurized gas. For example, in the case where the reflow process is performed under the condition of pressurized gas, it may be possible to suppress the thermal expansion of the encapsulant and to improve bonding uniformity and positional precision. However, according to this method, it may be necessary to perform a back-grinding process to planarize the encapsulant coated on the base wafer. Furthermore, to clean and remove grinding wastes and bump oxide, which are produced by the back-grinding process, it may be necessary to perform a surface cleaning and deoxidization process.

Furthermore, there is a method of coating the base wafer with the encapsulant, like NCP, but for an ultra-fine semiconductor device with a small bump pitch, such a method may suffer from extremely low filling and void-removal properties. Accordingly, it is hard to apply the NCP method to products that have a bump pitch of 50 μm or less.

The disclosure provides one or more possible solutions to the above-noted issues.

In detail, the disclosure relates to a semiconductor device fabrication method, which includes a process of mounting the semiconductor chip with TSVs on the base wafer, and an encapsulant. In the fabrication method according to an example embodiment, the base wafer provided with fine interconnection lines may be uniformly coated with the encapsulant of a desired thickness, without the void issue. Thus, a process of planarizing the encapsulant may be unnecessary.

Furthermore, the encapsulant according to an example embodiment may contain a main ingredient (e.g., resin or the like) and a flux ingredient, which is changed to a cross-linking structure after the curing process. Thus, the encapsulant according to an example embodiment may not be volatilized by the reflow process. Accordingly, in the semiconductor device fabrication method using the encapsulant, it may be unnecessary to perform an oxide removal process, after stacking the semiconductor chip, which includes the encapsulant in the B-stage state, on the base wafer. Furthermore, since the gas pressure is maintained to 1.0 MPa or higher during the reflow process, the pressing force may not be weak, even when the number of bumps is increased. Moreover, it may be possible to suppress many other issues, such as the formation of void and the warpage or misalignment of the semiconductor chip, during the reflow process. Accordingly, in the semiconductor device fabrication method according to an example embodiment, the bump bonding process may be performed in units of a base wafer or in bulk.

According to an example embodiment, a method of fabricating a semiconductor device may include forming an encapsulant on a chip wafer with a plurality of semiconductor chips, performing a pre-curing process on the encapsulant, which is formed on the chip wafer, to form a B-staged encapsulant, dicing the chip wafer, along with the B-staged encapsulant, to separate the semiconductor chips from each other, stacking the semiconductor chips on a base wafer, such that a coupling electrode formed on the base wafer faces a bump electrode of each of the semiconductor chips with a conductive adhesive element interposed therebetween, thereby forming a chip stack including the base wafer and the semiconductor chips on the base wafer, performing a reflow process on the chip stack under a pressurized gas to bond the coupling electrode and the bump electrode, between which the conductive adhesive element is interposed, to each other, and performing a post-curing process on the chip stack, in which the coupling electrode and the bump electrode are bonded to each other with the conductive adhesive element interposed between, under a pressurized gas to form a C-staged encapsulant.

In an example embodiment, the reflow process and the post-curing process may be performed under gas pressurized to 1.0 MPa or higher.

In an example embodiment, the reflow process and the post-curing process may be performed under gas pressurized to the same pressure.

In an example embodiment, the forming of the encapsulant may include providing the encapsulant using a spray.

In an example embodiment, the bonding of the coupling and bump electrodes, between which the conductive adhesive element is interposed, may include aligning the coupling electrode and the bump electrode to each other in a self-alignment manner.

According to an example embodiment, an encapsulant may be configured to cover a chip wafer. The encapsulant may be configured to be in a B-stage by a pre-curing process. The encapsulant may be provided to allow the chip wafer to be divided into a plurality of semiconductor chips, when the encapsulant, along with the chip wafer, is diced after being in the B-stage state. The encapsulant may be provided to be stacked on a base wafer, along with at least one semiconductor chip of the plurality of semiconductor chips such that the semiconductor chip is stacked on the base wafer such that a coupling electrode on the base wafer and a bump electrode of the semiconductor chip face each other with a conductive adhesive element interposed therebetween. A reflow process may be performed on the chip stack under pressurized gas to bond the coupling electrode and the bump electrode to each other with the conductive adhesive element interposed therebetween and the chip stack may include the base wafer and the plurality of the semiconductor chips on the base wafer. The encapsulant may be configured to be in a C-stage state by a post-curing process and the post-curing process may be performed on the chip stack under pressurized gas after the reflow process.

In an example embodiment, the encapsulant may include epoxy resin and phenolic resin and may form a cross-linking structure by the post-curing process.

In an example embodiment, the encapsulant may include a flux ingredient that is not volatilized in the reflow process.

In an example embodiment, a weight reduction ratio of the encapsulant by the reflow process may be less than or equal to 0.2%.

In an example embodiment, a thixotropic index of the encapsulant may range from 1.1 to 3.5.

In an example embodiment, the encapsulant may include a filler having a particle diameter of 15 μm or smaller.

In an example embodiment, the reflow process and the post-curing process may be performed under gas pressurized to 1.0 MPa or higher.

While example embodiments have been particularly shown and described, it will be understood by one of ordinary skill in the art that variations in form and detail may be made therein without departing from the spirit and scope of the attached claims.

What is claimed is:

1. A method of fabricating a semiconductor device, the method comprising
    forming an encapsulant on a chip wafer;
    performing a pre-curing process on the encapsulant, which is formed on the chip wafer, to form a B-staged encapsulant;
    dicing the chip wafer, along with the B-staged encapsulant, to divide the chip wafer into a plurality of semiconductor chips that are separate from each other;
    stacking the plurality of semiconductor chips on a base wafer, such that a coupling electrode provided on the base wafer faces a respective bump electrode of each semiconductor chip from among the plurality of semiconductor chips with a conductive adhesive element interposed between the coupling electrode and each bump electrode, thereby forming a chip stack including the base wafer and the plurality of semiconductor chips on the base wafer;
    performing a reflow process on the chip stack under a first pressurized gas to bond the coupling electrode and each bump electrode, between which the conductive adhesive element is interposed, to each other; and
    performing a post-curing process on the chip stack, in which the coupling electrode and each bump electrode are bonded to each other with the conductive adhesive element interposed between, under a second pressurized gas to form a C-staged encapsulant.

2. The method of claim 1, wherein each of the first pressurized gas and the second pressurized gas are pressurized to 1.0 MPa or higher.

3. The method of claim 2, wherein the first pressurized gas and the second pressurized gas are pressurized to a same pressure.

4. The method of claim 1, wherein the forming of the encapsulant comprises providing the encapsulant using a spray.

5. The method of claim 1, wherein in bonding the coupling electrode and each bump electrode, the coupling electrode with each bump electrode are aligned in a self-alignment manner.

6. A method of forming a semiconductor device, the method comprising:
    covering a chip wafer with an encapsulant;
    partially curing the encapsulant by applying heat;
    dicing the chip wafer and partially cured encapsulant to divide the chip wafer a plurality of semiconductor chips that are separate from each other, each semiconductor chip from among the plurality of semiconductor chips comprising a respective portion of the chip wafer and a respective portion of the partially cured encapsulant;
    stacking at least one semiconductor chip from among the plurality of semiconductor chips onto a base wafer;
    applying a first pressurized gas to the partially cured encapsulant; and
    fully curing the partially cured encapsulant by applying a second pressurized gas.

7. The method of claim 6, wherein the encapsulant comprises a solvent, and
    wherein the partial curing of the encapsulant comprises evaporating the solvent.

8. The method of claim 6, wherein the stacking of the at least one semiconductor chip comprises adhering the at least one semiconductor chip to the base wafer using the partially cured encapsulant.

9. The method of claim 6, wherein the covering of the chip wafer with the encapsulant comprises spraying the encapsulant onto the chip wafer while the encapsulant is in a liquid state.

10. The method of claim 6, wherein the encapsulant comprises a filler, an epoxy resin, a phenolic resin, a solvent, and a flux.

11. The method of claim 6, wherein the partial curing of the encapsulant comprises bonding a plurality of bump electrodes formed on the plurality of semiconductor chips to a plurality of coupling electrodes formed on the base wafer using a conductive adhesive element.

12. The method of claim 11, wherein the encapsulant comprises a flux, and
   wherein the partial curing of the encapsulant comprises heating the encapsulant to a temperature at which the conductive adhesive element is melted without volatilizing the flux.

13. The method of claim 6, wherein the first pressurized gas and the second pressurized gas are applied at a same pressure.

* * * * *